United States Patent
Kaneko

(10) Patent No.: US 6,594,296 B1
(45) Date of Patent: Jul. 15, 2003

(54) SURFACE-EMITTING LASER AND METHOD OF FABRICATION THEREOF

(75) Inventor: Takeo Kaneko, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/308,907

(22) PCT Filed: Oct. 5, 1998

(86) PCT No.: PCT/JP98/04485

§ 371 (c)(1),
(2), (4) Date: Jul. 8, 1999

(87) PCT Pub. No.: WO99/18641

PCT Pub. Date: Apr. 15, 1999

(30) Foreign Application Priority Data

Oct. 8, 1997 (JP) .............................. 9-291599

(51) Int. Cl.[7] .............................. H01S 5/00; H01S 3/08
(52) U.S. Cl. .............................. 372/46; 372/45; 372/96
(58) Field of Search .............................. 372/45, 46, 96

(56) References Cited

U.S. PATENT DOCUMENTS

| | | | | |
|---|---|---|---|---|
| 3,701,047 A | * | 10/1972 | Caplan et al. | 372/49 |
| 4,111,521 A | * | 9/1978 | Streifer et al. | 372/50 |
| 5,086,430 A | | 2/1992 | Kapon et al. | 372/50 |
| 5,319,661 A | * | 6/1994 | Irikawa et al. | 372/46 |
| 5,359,618 A | | 10/1994 | Lebby et al. | 372/45 |
| 5,478,774 A | * | 12/1995 | Ackley et al. | 438/39 |

FOREIGN PATENT DOCUMENTS

| | | |
|---|---|---|
| JP | A-1-239984 | 9/1989 |
| JP | A-5-145189 | 6/1993 |
| JP | A-6-350194 | 12/1994 |
| JP | A-8-88435 | 4/1996 |
| JP | A-9-27650 | 1/1997 |
| JP | A-9-116227 | 5/1997 |
| JP | A-10-65266 | 3/1998 |
| JP | A-10-200210 | 7/1998 |

OTHER PUBLICATIONS

Casey Jr et al, Heterostructure Lasers: Part A: Fundamental Principles, New York: Academic Press, 1978 (no month available), pp. 45.*

* cited by examiner

Primary Examiner—Quyen Leung
(74) Attorney, Agent, or Firm—Oliff & Berridge, PLC.

(57) ABSTRACT

The present invention provides a surface-emitting laser which is capable of emitting a laser beam with a single-peak spatial distribution, but is incapable of guiding modes other than a single transverse mode, and a method of fabrication thereof. The laser comprises a columnar portion (20) that forms part of a reflective mirror on a light-emitting side and an embedding layer (22) that surrounds the periphery of this columnar portion (20). The columnar portion (20) is made of single-crystalline AlGaAs and the embedding layer (22) is made of polycrystalline AlGaAs. The absolute refractive index of the embedding layer (22) is slightly smaller than that of the columnar portion (20), thus a laser beam with a single transverse mode is obtained.

6 Claims, 6 Drawing Sheets

SURFACE-EMITTING LASER AND METHOD OF FABRICATION THEREOF

TECHNICAL FIELD

The present invention related to a single transverse mode type of surface-emitting laser and a method of fabrication thereof.

BACKGROUND OF ART

A surface-emitting laser is known in the art in which a resonator post is formed as a column from an upper mirror and an embedding layer is formed around the periphery thereof. The resistance of this embedding layer is increased by ion implantation to ensure that current flows only through the resonator post.

However, the surface-emitting laser of this configuration emits laser beams in transverse modes that are controlled by the distribution of current, because there is substantially no difference in absolute refractive index (refractive index with respect to vacuum) between the resonator post and the embedding layer. In other words, a large proportion of the current flows through outer peripheral portions of the resonator post so that higher, ring-shaped transverse modes appear.

Furthermore, the other structure of the surface emitting laser has materials of low refractive indices, such as air, around the periphery of the resonator post so that a large difference in absolute refractive indices is created therebetween and thus the higher transverse modes are also enclosed therein. It is therefore impossible to cut out the higher transverse modes.

This makes it impossible for a conventional surface-emitting laser to achieve a laser beam that lases with a single transverse mode, particularly when a high level of power is required. It is therefore necessary to provide an optical system for focusing the laser beam when this surface-emitting laser is used in an optical information apparatus or the like.

The present invention was devised in order to solve the above problems of the prior art and thus provides a surface-emitting laser which is capable of emitting a laser beam with a single-peak spatial distribution, but is incapable of guiding modes other than a single transverse mode, and a method of fabrication thereof.

DISCLOSURE OF INVENTION (1) A vertical-cavity surface-emitting laser in accordance with an aspect of the present invention comprises:
   a columnar portion formed of at least part of a reflective mirror on a light-emitting side and an embedding layer surrounding the periphery of the columnar portion,
   wherein the embedding layer has an absolute refractive index that is slightly smaller than that of the columnar portion.

This aspect of the invention also has an embedding layer surrounding the periphery of the columnar portion, and the absolute refractive index (refractive index with respect to vacuum) of the embedding layer is made to be smaller than the absolute refractive index of the columnar portion. This configuration makes it possible to ensure that all the light is totally reflected within the columnar portion and is enclosed thereby, in a manner similar to an optical fiber.

It is known that, when the radius of the core of an optical fiber and the difference in absolute refractive indexes between the core and cladding are large, a large number of modes can be transmitted thereby. Therefore, in order to transmit a single mode only, it is necessary to ensure that, when one of the radius and absolute refractive index of the core is large, the other one of them is correspondingly small. In a similar manner, it is necessary with the present invention to ensure that at least one of the radius of the columnar portion and the difference in absolute refractive indices is small, to transmit in a single transverse mode.

Furthermore, the difference in absolute refractive indices is made to be very small in this aspect of the invention, so that the radius of the columnar portion can be made as large as possible in correspondence thereto. The columnar portion is formed from at least part of a reflective mirror on a light-emitting side, so that if the radius of the columnar portion is made large, the light-emitting portion thereof is also large, and thus the optical output can be increased.

(2) With respect to the above described surface-emitting laser, it is preferable that:
   a material forming the columnar portion is made to be single crystal; and
   a material forming the embedding layer is the same material as that of the columnar portion, but is made to be non-single crystal.

The same material has a higher density and a higher absolute refractive index when it is made single crystalline, whereas it has a slightly lower density and a slightly lower absolute refractive index when it is made non-single crystalline (polycrystalline or non-crystalline). It is therefore possible to change the absolute refractive index slightly by making the material either single crystalline or non-single crystalline.

(3) With respect to the above described surface-emitting laser, the columnar portion may have a diameter of at least approximately 3 µm; and
   the difference in the absolute refractive index between the columnar portion and the embedding layer may be not more than approximately 0.01.

Making the diameter of the columnar portion at least approximately 3 µm in this manner makes it possible to obtain a practicable laser beam output. In addition, to ensure transmission only in a single transverse mode when the diameter of the columnar portion is at least approximately 3 µm, the absolute refractive index is made to be no more than approximately 0.01.

(4) It is preferable, relating to the above described surface-emitting laser, that:
   the embedding layer has a low electrical resistance; and
   an insulating layer is formed below the embedding layer.

Lowering the electrical resistance of the embedding layer in this manner makes it possible to restrain the generation of heat therein. In addition, the insulation layer ensures that no current flows below the embedding layer and thus the current is concentrated below the columnar portion, making it possible to obtain a high-power laser beam.

(5) A method of fabricating a vertical-cavity surface-emitting laser in accordance with another aspect of the present invention comprises the steps of:
   forming a first single crystal layer at a position above an active layer but below a reflective mirror on a light-emitting side;
   forming a non-single crystal layer on the first single crystal layer;
   forming an aperture portion in part of the non-single crystal layer, to form an exposed portion of the first single crystal layer; and growing a multi-layer film non-selectively on the non-single crystal layer that comprises the aperture portion, wherein the multi-layer film is made to be non-single crystal on the multi-layer film and single crystal above the aperture portion.

With this aspect of the invention, the single crystal layer is exposed from the aperture portion, so that the multi-layer film that is grown by non-selective growth becomes a single crystal columnar portion above the aperture portion and a non-single crystal (polycrystalline or non-crystalline) embedding layer on the periphery thereof. Thus the above described surface-emitting laser can be fabricated in a simple manner.

(6) In relation to the above described method of fabricating a surface-emitting laser, it is preferable that:

the multi-layer film is grown after a second single crystal layer has been selectively grown only on the exposed portion of the first single crystal layer.

This ensures that the aperture portion of the non-single crystal layer is embedded with a single crystal layer and the surface of the exposed portion of the non-single crystal layer is flattened, so that the multi-layer film that is subsequently grown non-selectively thereon as the emitting-side mirror can be grown uniformly over a wide region.

(7) It is preferable, relating to the above described method of fabricating a surface-emitting-laser, that:

the growth of the multi-layer film is performed after the growth of an AlAs layer.

An AlAs layer grows easily in a non-selective manner on the non-single crystal layer and the single crystal layer, so that if such an AlAs layer is formed initially, it is easy to grow a multi-layer film of any composition thereafter.

(8) It is preferable, in relation to the above described method of fabricating a surface-emitting laser, that:

the multi-layer film has a low electrical resistance; and the non-single crystal layer is an insulating film.

This makes it possible to form an insulating film below the region where part of the multi-layer film will form the embedding layer. Since the electrical resistance of the multi-layer film is lowered, the generation of heat in the embedding layer can be restrained, and the insulation film ensures that the current is concentrated below the columnar portion formed from the multi-layer film.

BEST MOST FOR CARRYING OUT THE INVENTION

Preferred embodiments of the present invention are described below with reference to the accompanying drawings.

First Embodiment

Figure 1:
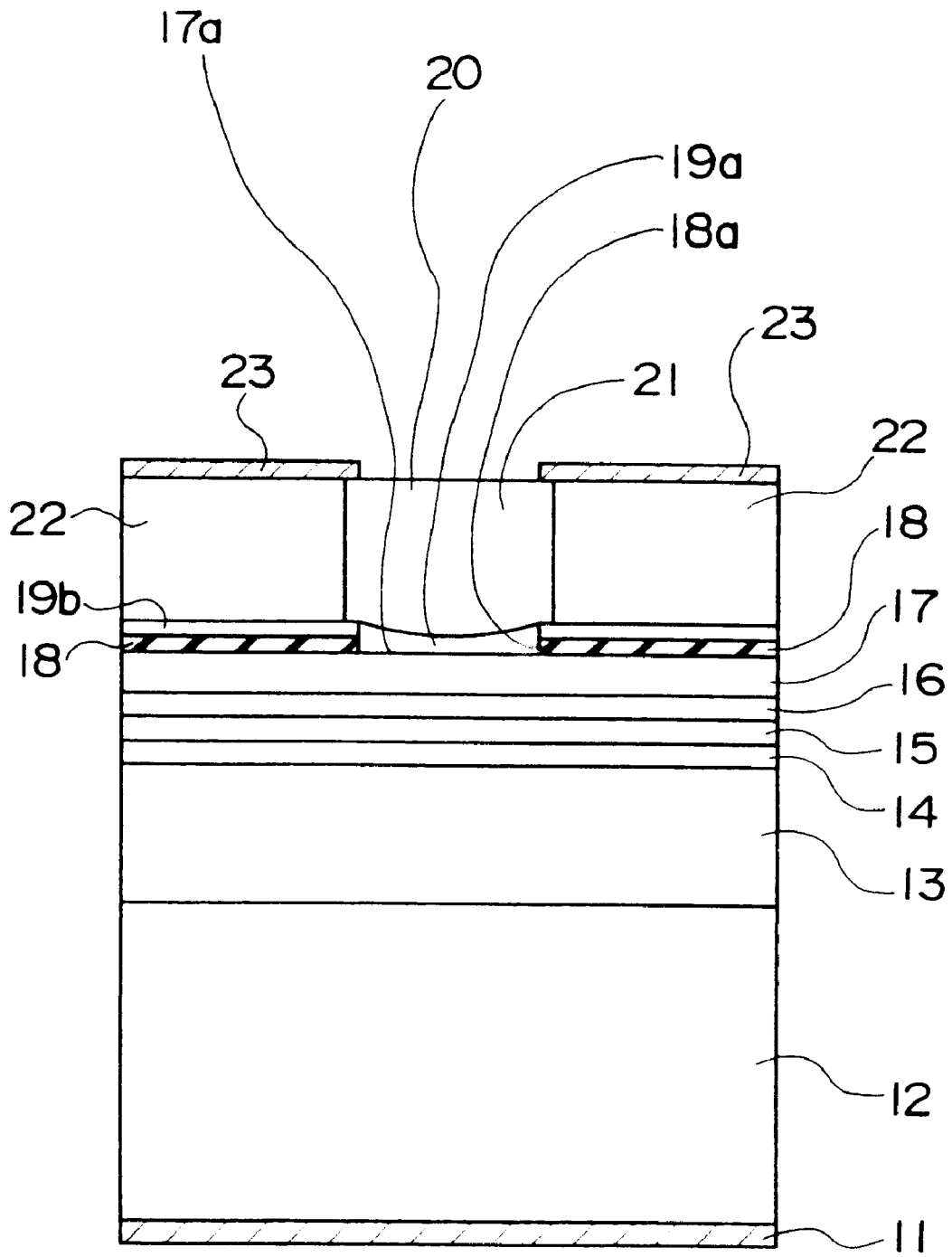
FIG. 1 is a cross-sectional view of a surface-emitting laser in accordance with a first embodiment of the present invention.

A cross-sectional view of a surface-emitting laser in accordance with the present embodiment is shown in FIG. 1.

In this figure, a lower electrode 11 is formed on a rear surface of a semiconductor substrate 12 formed of n-type GaAs or the like, by way of example.

A lower reflective mirror 13 is formed above the semiconductor substrate 12. The lower reflective mirror 13 is a distributed reflection type of multi-layer reflective mirror (a distributed Bragg reflector, abbreviated to DBR) having a reflectivity of at least 99.5% with respect to light of wavelengths in the vicinity of 800 nm, formed of 40 pairs of n-type $Al_{0.8}Ga_{0.2}As$ layers and $Al_{0.15}Ga0.85.As$ layers, by way of example.

A cladding layer 14, an active layer 15, and another cladding layer 16 are formed in that order from the bottom upward on the lower reflective mirror 13. The cladding layer 14 is formed of an n-type $Al_{0.7}Ga_{0.3}As$ layer, by way of example, the active layer 15 is a multi-well structure formed of n-type GaAs well layers and n-type $Al_{0.3}Ga_{0.7}As$ barrier layers, by way of example, and the cladding layer 16 is a p-type $Al_{0.7}Ga_{0.3}As$ layer, by way of example.

A first single crystal layer 17 is formed on the cladding layer 16 and a non-single crystal layer 18 is formed on the first single crystal layer 17. The first single crystal layer 17 is of single crystal $Al_{0.5}Ga_{0.85}As$ and forms part of an upper reflective mirror. The non-single crystal layer 18 is made of an oxide film such as polycrystalline or non-crystalline $SiO_2$, and has insulating properties. An aperture portion 18a is formed in the non-single crystal layer 18. A single crystal AlAs layer 19a is formed on an exposed portion 17a of the first single crystal layer 17 and a non-single crystal AlAs layer 19b is formed on the non-single crystal layer 18.

A columnar portion 20 of a diameter of at least approximately 3 $\mu$m is formed on the AlAs layer 19a. The columnar portion 20 is a multi-layer film formed of alternate single crystal $Al_{0.8}Ga_{0.2}As$ layers and single crystal $Al_{0.15}Ga_{0.85}As$ layers. Note that an $Al_{0.15}Ga_{0.85}As$ layer having a low proportion of Al is formed on the AlAs layer 19a. The AlAs layer 19a and the columnar portion 20 configure a reflective mirror on the light-emitting side.

An embedding layer 22 is formed around the periphery of the columnar portion 20. The embedding layer 22 is a multi-layer film formed of alternate non-single crystal AlAs layers, non-single crystal $Al_{0.8}Ga_{0.2}As$ layers, and non-single crystal $Al_{0.15}Ga_{0.85}As$ layers. In this case, "non-single crystal" means either polycrystalline or non-crystalline. The materials forming the embedding layer 22 are the same materials as those forming the columnar portion 20, except that they are made non-single crystalline. If the same materials are used, the non-single crystal form of each has a density less than that of the single crystal form, so the absolute refractive index of the non-single crystal embedding layer 22 is slightly (by approximately 0.01) less than that of the single crystal columnar portion 20. In addition, the electrical resistance of the embedding layer 22 is lower. Note that the AlAs layer 19b is formed on the insulation layer 18.

An upper electrode 23 is formed to extend from above the embedding layer 22 to an outer peripheral edge portion of a contact layer 21 that is positioned on the surface of the columnar portion 20. The upper electrode 23 supplies current to the contact layer 21 of the columnar portion 20.

The surface-emitting laser of the present embodiment is configured as described above. To summarize the action thereof: the configuration is such that light is generated in the active layer 15; a resonator comprises the lower reflective mirror 13 and the emitting-side reflective mirror that is formed by the AlAs layer 19a and the columnar portion 20; and the light resonates within this resonator. The energy lost by this generation of light is supplied by the current flowing between the upper electrode 23 and the lower electrode 11. Light that transmits through the contact layer 21 of the columnar portion 20 forms an optical power. This surface-emitting laser is configured to have a resonator that is perpendicular to the semiconductor substrate 12, so it is classified as a vertical-cavity type.

In the present embodiment of the invention, the diameter of the columnar portion 20 is approximately 3 $\mu$m so the size of the light-emitting portion can be equally large, making it possible to obtain a practicable optical output.

In addition, the absolute refractive index of the embedding layer 22 surrounds the AlAs layer 19a and the columnar portion 20 which form the reflective mirror on the light-emitting side, and is made to be slightly lower (by approximately 0.01) than that of the AlAs layer 19a and the columnar portion 20. This means that the AlAs layer 19a and the columnar portion 20 transmit light only in a single transverse mode. Thus the present embodiment makes it possible to emit a single-peak laser beam.

With the present embodiment, the electrical resistance of the embedding layer 22 is made to be lower, so that current from the upper electrode 23 flows not only from the contact layer 21 but also from the embedding layer 22 into the columnar portion 20. Therefore, the generation of heat in the embedding layer 22 is restrained. The non-single crystal layer 18 below the embedding layer 22 acts as an insulation layer so that the current flowing through the embedding layer 22 does not flow into the first single crystal layer 17 therebelow. This causes the current to concentrate, directly below the columnar portion 20, in the active layer 15, making it possible to obtain a high-power laser beam.

An example of the method of fabricating the surface-emitting laser of FIG. 1 will now be described with reference to FIGS. 2A to 3B.

Figure 2A:
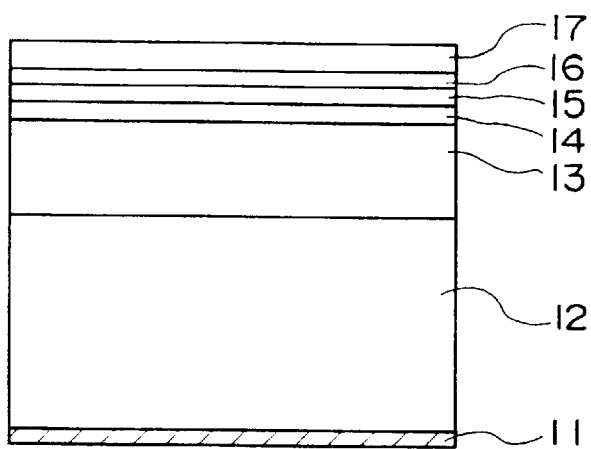
FIGS. 2A to 2C show an example of a method of fabricating a surface-emitting laser in accordance with the first embodiment, FIGS. 3A and 3B also show an example of a method of fabricating a surface-emitting laser in accordance with the first embodiment.

First of all, as shown in FIG. 2A, the lower electrode 11 is formed on the rear surface of the semiconductor substrate 12 and also the layers from the lower reflective mirror 13 to the first single crystal layer 17 are grown by a method such as metal organic chemical vapor deposition (MOCVD) or molecular beam epitaxy (MBE) on the upper surface of the semiconductor substrate 12. Note that the first single crystal layer 17 is made of single crystal AlGaAs.

Figure 2B:
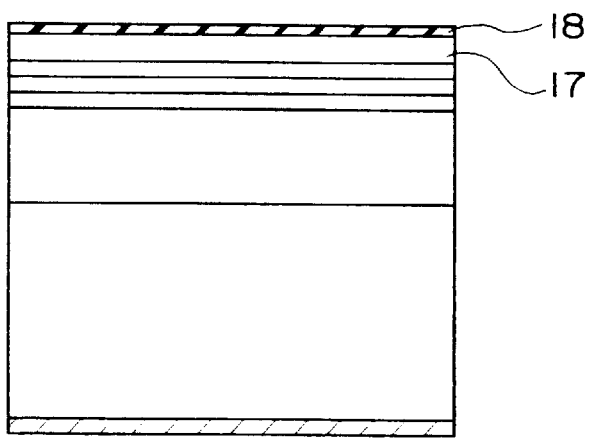

The non-single crystal layer 18 is then formed on the first single crystal layer 17, as shown in FIG. 2B. This non-single crystal layer 18 is a non-single crystal (polycrystalline or non-crystalline) oxide film of $SiO_2$ or the like, grown by a method such as CVD or sputtering.

Alternatively, the surface of the first single crystal layer 17 could be oxidized to form a non-single crystal aluminum oxide layer which can be used as the non-single crystal layer 18.

Figure 2C:
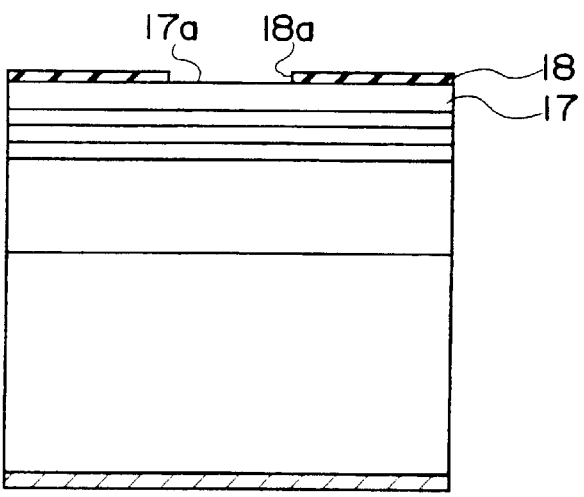

The aperture portion 18a is then formed in the non-single crystal layer 18, to form the exposed portion 17a of the first single crystal layer 17, as shown in FIG. 2C. A photolithography technique could be applied to the formation of the aperture portion 18a.

Note that passivation is preferably applied on the surface of the single crystal layer 17. This could be done by, for example, degrease cleaning, coating with ammonium sulfide, then performing high-temperature processing, or by cleaning with ultrapure water then performing high-temperature processing.

Figure 3A:
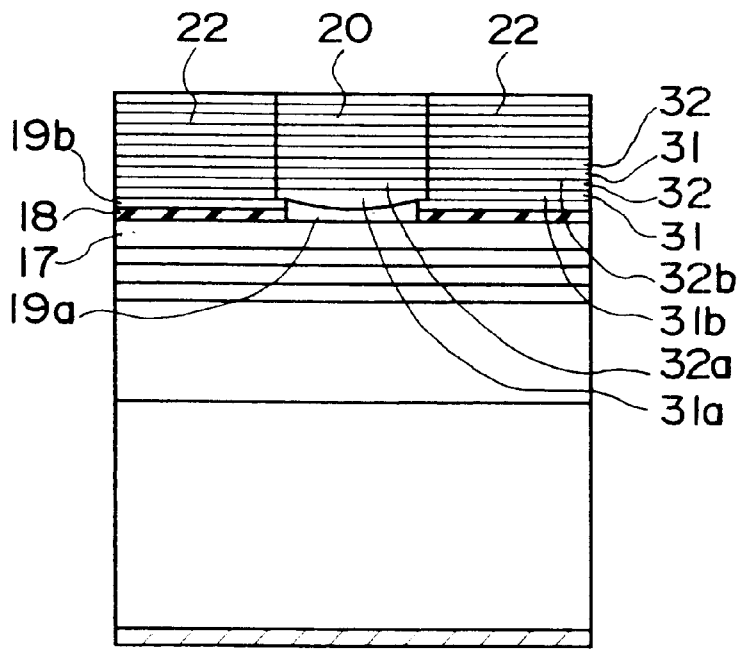

Subsequently, AlAs is grown by MOCVD on the non-single crystal layer 18 and the first single crystal layer 17, as shown in FIG. 3A. Thus AlAs is grown non-selectively to form the AlAs layers 19a and 19b on the non-single crystal layer 18 and the first single crystal layer 17.

The AlAs layer 19a is made to be single crystal on the single crystal layer 16 but the AlAs layer 19b is made to be non-single crystal (polycrystalline or non-crystalline) on the insulation layer 18.

$Al_{0.15}Ga_{0.85}As$ layers 31 and $Al_{0.8}Ga_{0.2}As$ layers 32 are then formed alternately on the AlAs layers 19a and 19b.

The $Al_{0.15}Ga_{0.85}As$ layers 31 and the $Al_{0.8}Ga_{0.2}As$ layers 32 are also made to be single crystal in portions 31a and 32a thereof that are positioned above the single crystal AlAs layer 19a and made to be non-single crystal (polycrystalline or non-crystalline) in portions 31b and 32b thereof that are positioned above the non-single crystal (polycrystalline or non-crystalline) AlAs layer 19b.

Thus the columnar portion 20 is formed from the single crystal portions 31a and 32a and the embedding layer 22 is formed from the non-single crystal portions 31b and 32b. In other words, the single crystal columnar portion 20 and the non-single crystal embedding layer 22 can be formed thereby. The columnar portion 20 and the AlAs layer 19a form a reflective mirror on the light-emitting side.

Note that when the first single crystal layer 17 has been formed, it is preferable to observe the longitudinal mode of the resonator configured by the first single crystal layer 17 and the lower reflective mirror 13, and adjust this longitudinal mode by adjusting the thickness of each of the films in the multi-layer film that configures the AlAs layer 19a and the columnar portion 20.

More specifically, the AlAs, $Al_{0.8}Ga_{0.2}As$, and $Al_{0.15}Ga_{0.85}As$ are preferably grown by MOCVD at a substrate temperature on the order of 650 to 800° C. (preferably approximately 750° C.), a reduced pressure on the order of 10 to 200 Torr (preferably approximately 145 Torr), using TMGa, TMAl, and $AsH_3$ as source materials.

Figure 3B:
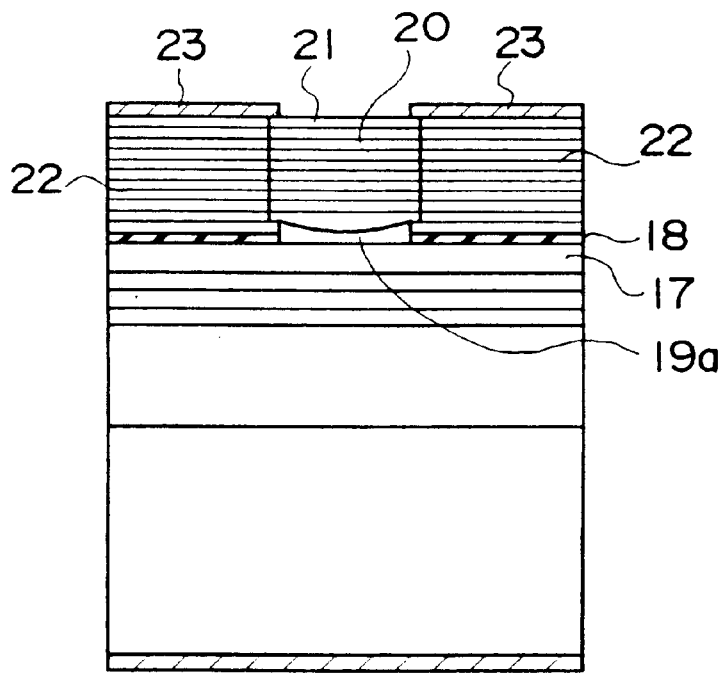

Next, the upper electrode 23 is formed on the embedding layer 22 in such a manner that it is in contact on the outer peripheral edge portion of the contact layer 21 that forms the uppermost layer of the columnar portion 20, as shown in FIG. 3B. More specifically, metal is vapor-deposited over the entire surface of the columnar portion 20 and the embedding layer 22, then part of the vapor-deposited metal is removed to form the upper electrode 23.

This fabrication method makes it possible to construct the surface-emitting laser shown in FIG. 1, by a simpler process than a process of forming the columnar portion 20 by a method such as dry etching, then forming the embedding layer 22 by re-growth around the non-single crystal area.

Second Embodiment

Figure 4:
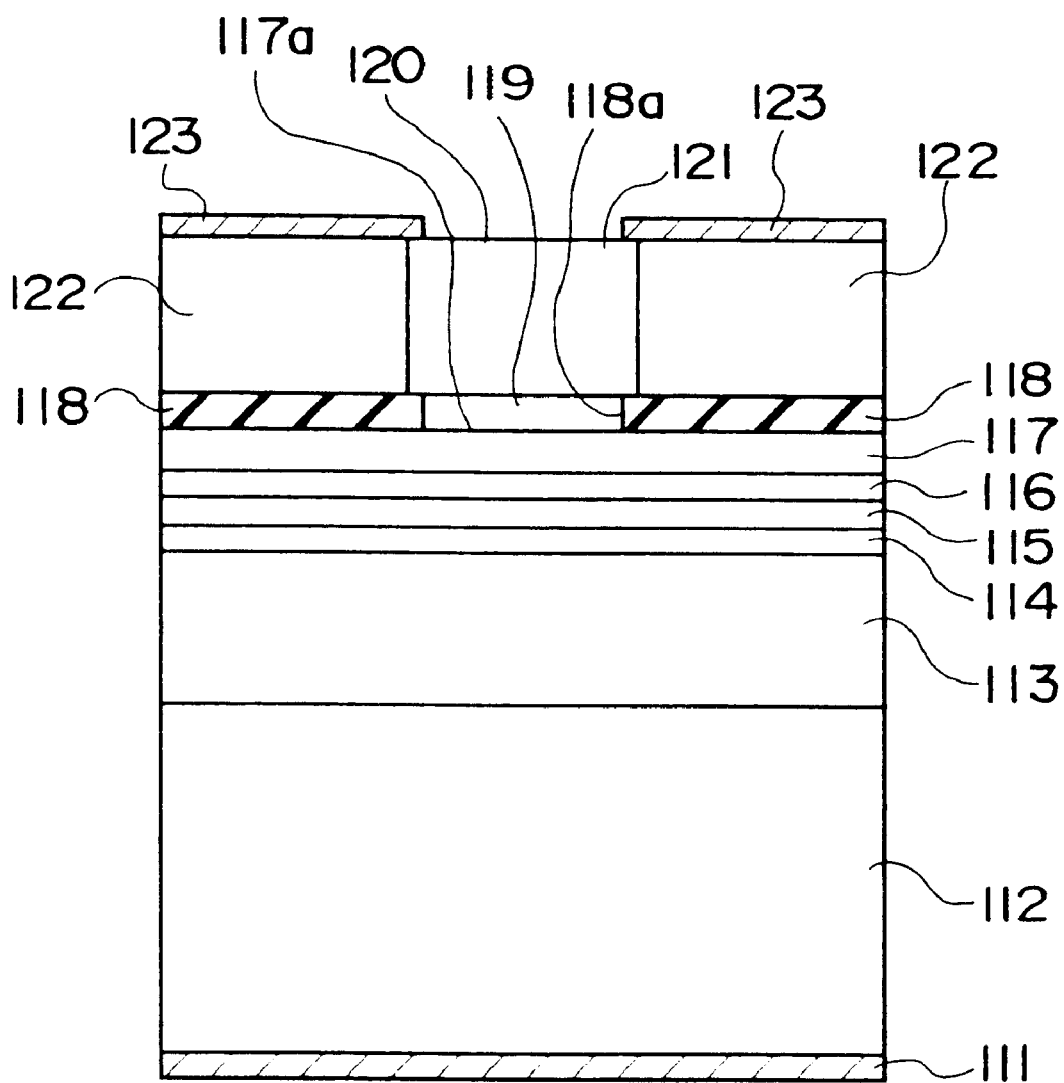
FIG. 4 is a cross-sectional view of a surface-emitting laser in accordance with a second embodiment of the present invention.

A cross-sectional view of a surface-emitting laser in accordance with a second embodiment is shown in FIG. 4.

In this figure, a lower electrode 11 is formed on a rear surface of a semiconductor substrate 112 formed of n-type GaAs or the like, by way of example.

A lower reflective mirror 113 is formed above the semiconductor substrate 112. The lower reflective mirror 113 is a distributed reflection type of multi-layer reflective mirror (a distributed Bragg reflector, abbreviated to DBR) having a reflectivity of at least 99.5% with respect to light of wavelengths in the vicinity of 980 nm, formed of 40 pairs of GaAs layers and $Al_{0.8}Ga_{0.2}As$ layers, by way of example.

A cladding layer 114, an active layer 115, and another cladding layer 116 are formed in that order from the bottom upward on the lower reflective mirror 113. The cladding layers 114 and 116 are formed of $Al_{0.3}Ga_{0.7}As$, by way of example, and the active layer 115 is a multi-well structure formed of InGaAs well layers and GaAs barrier layers, by way of example.

A first single crystal layer 117 is formed on the cladding layer 116 and a non-single crystal layer 118 is formed on the first single crystal layer 117. The first single crystal layer 117 is made of single crystal $Al_{0.8}Ga_{0.2}As$ and becomes part of the upper reflective mirror. The non-single crystal layer 118 is made of an oxide film such as polycrystalline or non-crystalline $SiO_2$, and has insulating properties. An aperture portion 118a is formed in the non-single crystal layer 118. A second single crystal layer 119 is formed on an exposed portion 117a of the first single crystal layer 117, so as to form an integral surface with the non-single crystal layer 118. The second single crystal layer 119 is made of GaAs.

A columnar portion 120 of a diameter of at least approximately 3 μm is formed on the second single crystal layer 119. The columnar portion 120 is a multi-layer film formed of alternate single crystal GaAs layers and single crystal $Al_{0.8}Ga_{0.2}As$ layers, on the single crystal AlAs layer. The first single crystal layer 117, the second single crystal layer 119, and the columnar portion 120 configure a reflective mirror on the light-emitting side.

An embedding layer 122 is formed around the periphery of the columnar portion 120. The embedding layer 122 is a multi-layer film formed of alternate non-single crystal GaAs layers and non-single crystal $Al_{0.8}Ga_{0.2}As$ layers, on the single crystal AlAs layer. In this case, "non-single crystal" means either polycrystalline or non-crystalline. The materials forming the embedding layer 122 are the same materials as those forming the columnar portion 120, except that they are made non-single crystalline. If the same materials are used, the non-single crystal form of each has a density less than that of the single crystal form, so the absolute refractive index of the non-single crystal embedding layer 122 is very slightly (by approximately 0.01) less than that of the single crystal columnar portion 120. In addition, the electrical resistance of the embedding layer 122 is lower.

An upper electrode 123 is formed on the embedding layer 122 in such a manner that it extends to an outer peripheral edge portion of a contact layer 121 that is positioned at the surface of the columnar portion 120. The upper electrode 123 supplies current to the contact layer 121 of the columnar portion 120.

The surface-emitting laser of the present embodiment is configured as described above. To summarize the action thereof: the configuration is such that light is generated in the active layer 115; a resonator comprises the lower reflective mirror 113 and the emitting-side reflective mirror that is formed by the first single crystal layer 117, the second single crystal layer 119, and the columnar portion 120; and the light resonates within this resonator. The energy lost by this generation of light is supplied by the current flowing between the upper electrode 123 and the lower electrode 111. Light that transmits through the contact layer 121 of the columnar portion 120 forms an optical power. This surface-emitting laser is configured to have a resonator that is perpendicular to the semiconductor substrate 112, so it is classified as a vertical-cavity type.

In the present embodiment too, the diameter of the columnar portion 120 is approximately 3 μm so the size of the light-emitting portion can be equally large, making it possible to obtain a practicable optical power.

In addition, the absolute refractive index of the embedding layer 122 is made to be slightly lower (by approximately 0.01) than that of the columnar portion 120 which is a part of the reflective mirror on the light-emitting side and which is surrounded by the embedding layer 122. This means that the columnar portion 120 transmits light only in a single transverse mode. Thus the present embodiment makes it possible to emit a single-peak laser beam.

With the present embodiment, the electrical resistance of the embedding layer 122 is made to be lower, so that current from the upper electrode 123 flows not only from the contact layer 121 but also from the embedding layer 122 into the columnar portion 120. Therefore, the generation of heat in the embedding layer 122 is restrained. The non-single crystal layer 118 below the embedding layer 122 acts as an insulating layer to ensure that the current flowing through the embedding layer 122 does not flow into the first single crystal layer 117 therebelow. This causes the current to concentrate, directly below the columnar portion 120, in the active layer 115, making it possible to obtain a high-power laser beam.

An example of the method of fabricating the surface-emitting laser of FIG. 4 will now be described with reference to FIGS. 5A to 6C.

Figure 5A:
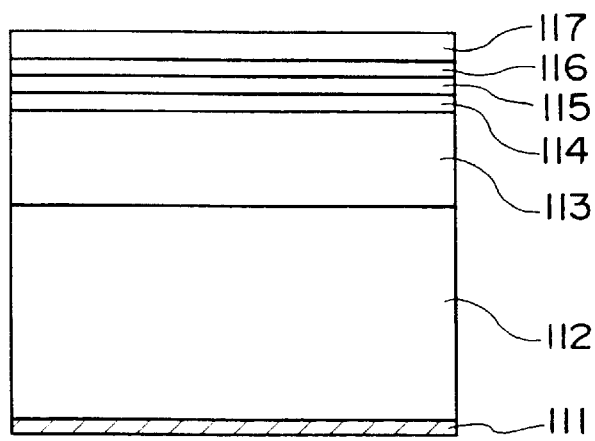
FIGS. 5A to 5C show an example of a method of fabricating a surface-emitting laser in accordance with the second embodiment, FIG. 6A to FIG. 6C also show an example of a method of fabricating a surface-emitting laser in accordance with the second embodiment.

First of all, as shown in FIG. 5A, the lower electrode 111 is formed on the rear surface of the semiconductor substrate 112 and also the layers from the lower reflective mirror 113 to the first single crystal layer 117 are grown by a method such as metal organic chemical vapor deposition or molecular beam epitaxy on the upper surface of the semiconductor substrate 112. Note that the first single crystal layer 117 is made of single crystal $Al_{0.8}Ga_{0.2}As$.

Figure 5B:
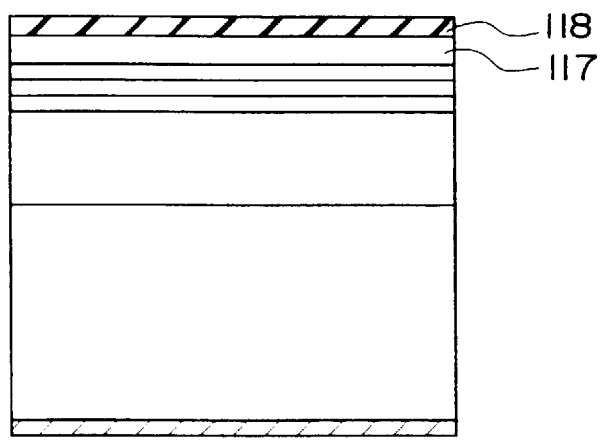

The non-single crystal layer 118 is then formed on the first single crystal layer 117, as shown in FIG. 5B. This non-single crystal layer 118 is a non-single crystal (polycrystalline or non-crystalline) oxide film of $SiO_2$ or the like, grown by a method such as CVD or sputtering.

Alternatively, the surface of the first single crystal layer 117 could be oxidized to form a non-single crystal aluminum oxide layer which can be used as the non-single crystal layer 118.

Figure 5C:
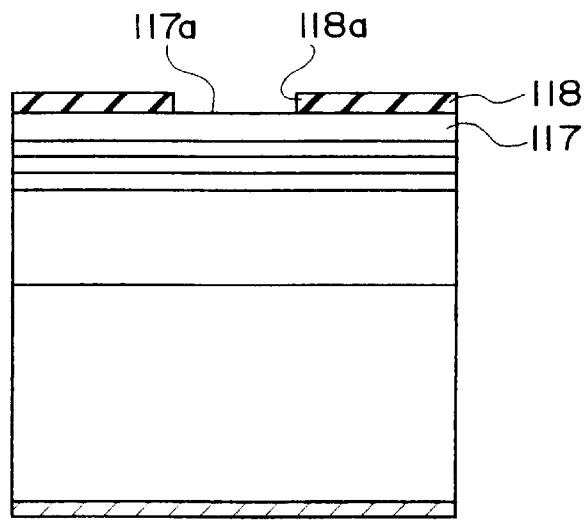

The aperture portion 118a is then formed in the non-single crystal layer 118, to form an exposed portion 117a of the first single crystal layer 117, as shown in FIG. 5C. A photolithography technique could be applied to the formation of the aperture portion 118a.

Alternatively, the configuration could be such that a thin AlGaAs layer is formed on the cladding layer 116, an AlAs layer is formed thereon as the uppermost layer, oxidation of the AlAs layer is suppressed at room temperature and in the atmosphere, aperture portions are formed in the AlAs layer by a photolithography technique, and, after parts of the AlGaAs have thereby been exposed, the AlAs layer is oxidized at approximately 400° C. in a steam atmosphere. In this case, the oxidized AlAs layer is equivalent to the non-single crystal layer 118 and the exposed portions of the AlGaAs layer are equivalent to the exposed portion 117a of the first single crystal layer 117.

Figure 6A:
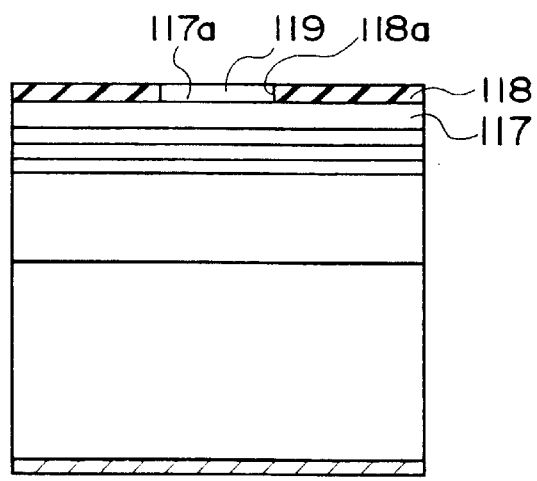

The second single crystal layer 119 is then formed on the exposed portion 117a of the first single crystal layer 117, so as to form an integral surface with the non-single crystal layer 118, as shown in FIG. 6A.

More specifically, GaAs is grown by MOCVD on the non-single crystal layer 118 and the exposed portion 117a in the state shown in FIG. 5C. The Ga ensures that this is selective growth, so the GaAs grows only on the exposed portion 117a formed of single crystal $Al_{0.8}Ga_{0.2}As$ but it does not grow at all on the non-single crystal layer 118 formed of an oxide film, such as $SiO_2$.

Note that this second single crystal layer 119 preferably has a thickness that is capable of forming one layer of the multi-layer film reflective mirror. It is therefore preferable that the non-single crystal layer 118 forming an integral surface with the second single crystal layer 119 is formed to the same thickness described above.

Note also that passivation is preferably applied on the surface of the single crystal layer 117. This could be done by, for example, degrease cleaning, coating with ammonium sulfide, then performing high-temperature processing, or by cleaning with ultrapure water then performing high-temperature processing.

Figure 6B:
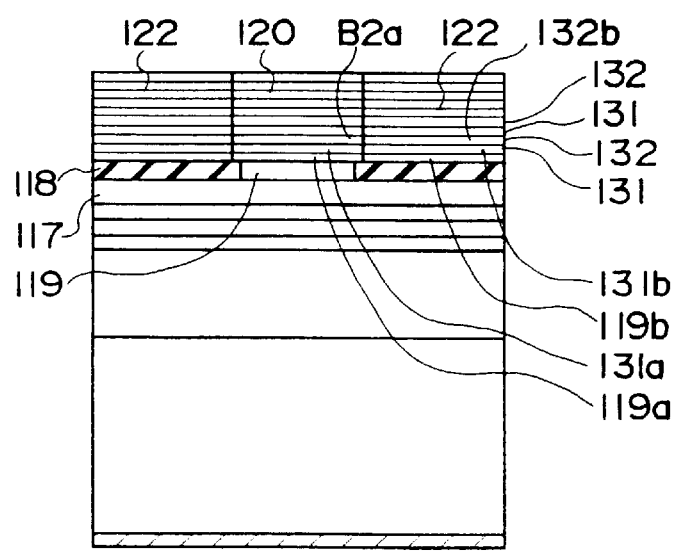

Subsequently, AlAs is grown by MOCVD on the non-single crystal layer 118 and the first single crystal layer 117, as shown in FIG. 6B. Thus AlAs is grown non-selectively to form the AlAs layers 119*a* and 119*b* on the non-single crystal layer 118 and the first single crystal layer 117.

The AlAs layer 119*a* is made to be single crystal on the second single crystal layer 119 but the AlAs layer 119*b* is made to be non-single crystal (polycrystalline or non-crystalline) on the non-single crystal layer 118.

GaAs layers 131 and $Al_{0.8}Ga_{0.2}As$ layers 132 are also made to be single crystal in portions 131*a* and 132*a* thereof that are positioned above the single crystal AlAs layers 119*a* and made to be non-single crystal (polycrystalline or non-crystalline) in portions 131*b* and 132*b* thereof that are positioned above the non-single crystal (polycrystalline or non-crystalline layer 119*b*.

Thus the columnar portion 120 is formed from the single crystal portions 131*a* and 132*a* and the AlAs layer 119*a*, and the embedding layer 122 is formed from the non-single crystal portions 131*b* and 132*b* and the AlAs layer 119*b*. In other words, the single crystal columnar portion 120 and the non-single crystal embedding layer 122 can be formed thereby.

Figure 6C:
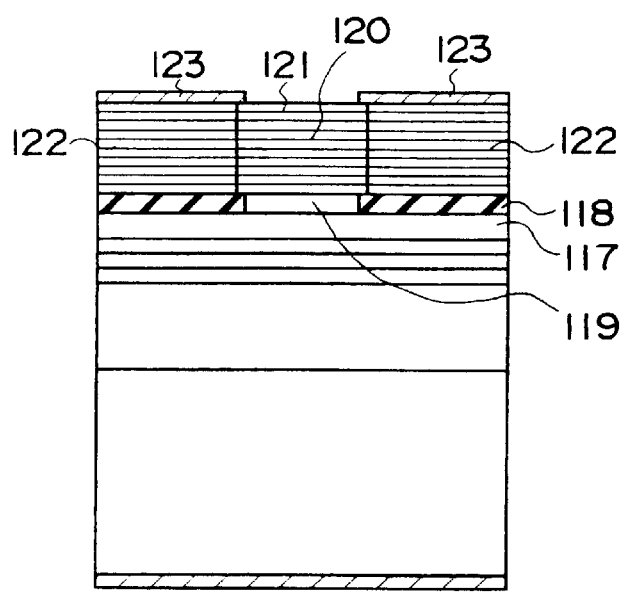

Next, the upper electrode 123 is formed on the embedding layer 122 in such a manner that it is in contact on the outer peripheral edge portion of the contact layer 121 that forms the uppermost layer of the columnar portion 120, as shown in FIG. 6C. More specifically, metal is vapor-deposited over the entire surface of the columnar portion 120 and the embedding layer 122, then part of the vapor-deposited metal is removed to form the upper electrode 123.

This fabrication method makes it possible to achieve effects similar to those of the first embodiment.

Note that the present invention is not limited to the above described embodiments, and thus it can be modified in various different ways. For example, a nitride semiconductor of Group III-V using N could be used instead of the As in the AlAs, $Al_{0.8}Ga_{0.2}As$, and $Al_{0.15}Ga_{0.85}As$ in the step shown in FIG. 3A.

What is claimed is:

1. A vertical-cavity surface-emitting laser, comprising:

a columnar portion formed of at least part of a reflective mirror on a light-emitting side;

an embedding layer surrounding the periphery of said columnar portion;

a first electrode, at least part of the first electrode formed above the embedding layer, the first electrode formed above a region excluding a central surface of the columnar portion;

an active layer to generate light, the light passing through the central surface of the columnar portion;

a lower reflective mirror; and a second electrode, wherein said embedding layer has an absolute refractive index that is slightly smaller than that of said columnar portion, and current flows into the columnar portion, at least part of the current flowing from the first electrode through the embedding layer into the columnar portion.

2. The surface-emitting laser as defined in claim 1, wherein:

a material forming said columnar portion is made to be single crystal; and a material forming said embedding layer is the same material as that of said columnar portion, but is made to be non-single crystal.

3. The surface-emitting laser as defined in claim 2, wherein:

an insulating layer is formed below said embedding layer.

4. The surface-emitting laser as defined in claim 1, wherein:

said columnar portion has a diameter of at least approximately 3 $\mu$m; and the difference in said absolute refractive index between said columnar portion said embedding layer is not more than approximately 0.01.

5. The surface-emitting laser as defined in claim 4, wherein:

an insulating layer is formed below said embedding layer.

6. The surface-emitting laser as defined in claim 1, wherein:

an insulating layer is formed below said embedding layer.

\* \* \* \* \*